United States Patent [19]

Kamil et al.

[11] Patent Number: 4,595,900
[45] Date of Patent: Jun. 17, 1986

[54] GRADIENT FIELD COILS FOR NMR IMAGING

[75] Inventors: Zvi Kamil, Tel Aviv; Stephen G. Lipson, Haifa, both of Israel

[73] Assignee: Elscint Ltd., Haifa, Israel

[21] Appl. No.: 668,942

[22] Filed: Nov. 7, 1984

[30] Foreign Application Priority Data

Nov. 13, 1983 [IL] Israel .................................. 70211

[51] Int. Cl.$^4$ .............................................. H01F 5/00
[52] U.S. Cl. ..................................... 335/299; 324/320
[58] Field of Search ................ 335/216, 299; 324/318, 324/319, 320, 321, 322

[56] References Cited

U.S. PATENT DOCUMENTS 4,362,993 12/1982 Young et al. .................... 324/320 X
4,486,711 12/1984 Frese et al. ...................... 324/320 X Primary Examiner—George Harris
Attorney, Agent, or Firm—Sandler & Greenblum

[57] ABSTRACT

A magnetic gradient field generating arrangement comprising a pair of oppositely disposed hollow cylindrical current conductive segments having current flowing in the same direction in the segments with the segments oriented to generate magnetic gradients $\nabla_x = \partial Bz/\partial X$.

14 Claims, 7 Drawing Figures

GRADIENT FIELD COILS FOR NMR IMAGING

FIELD OF THE INVENTION

This invention is concerned with NMR imaging and more particularly to arrangements and methods for generating gradient fields for NMR imaging systems.

BACKGROUND OF THE INVENTION

In about 1973 linear field gradients were first used with NMR equipment to "locate" the resonant frequency response. This expedient made it possible to reconstruct images from free induction decay (FID) responses occasioned by temporarily subjecting objects located in strong static magnetic fields to rotating radio frequency fields. Since then scientists in the field have been attempting to find coil arrangements that provide the most stable, homogeneous, orthogonal and linear gradient fields.

Among other things the gradient fields have to be switched on and off in short time periods, thus it is desirable that they have relatively low inductances.

The prior art gradient generating coils comprise, among other things, four theoretically infinite conductors equidistantly spaced apart in each of the four quadrants of the plane defined by the direction of the static field and the directions of the gradient. The conductors are normal to that plane. Thus, a gradient $\nabla_x$ is generated by conductors normal to the XZ plane. Practically of course the gradient coil conductors are finite and the coils have been described aptly by their finite shapes as "trapezoidal", "rectangular", "saddle" and the like.

To keep the inductance low the prior art gradient coils have had a relatively small number of turns. The small number of turns, of course acts to reduce the gradient magnetic field strength. The use of the coils unfortunately have have a deleterious effect on the decay which in turn adversely affects the detected FID signals. Also, the coils inherently have resistance and therefore generate heat which is wasted energy. In addition to resistive generated heat there are eddy current losses in the coils that increase the power consumption. Thus the prior art gradient generating coils adversely affect the FID signals while locating them. The gradient coils also introduces power losses.

Both the linearity and orthonogality of the field generated by a coil are a function of the geometry of the system, being contingent on such details as the geometrical location of each of the turns relative to other turns, among other things. It is difficult to obtain geometrical relationships, with the prior art gradient coils, that ensure linearity and orthonogality. Accordingly there is a real present need for improved gradient field generating arrangements.

BRIEF DESCRIPTION OF THE INVENTION

In accordance with a broad aspect of this invention, a gradient field generating arrangement useful for generating gradient fields in NMR imaging systems is provided; said gradient field generating arrangement comprising:

a pair of oppositely disposed electrical current conductive segments of a hollow cylinder, said segments being substantially equidistantly spaced from a common longitudinal axis, means for causing current to flow in the same direction in each of said pair of segments, the direction of the current generating magnetic fields parallel to said longitudinal axis, the combined field from said pair of segments being zero at all points in a first plane which is the mirror symmetry plane which relates one segment to the other, said combined field varying substantially linearly in a second plane which contains the longitudinal axis, is normal to the said first plane and longitudinally bisects said pair of segments, and said combined field being positively maximum where said second plane bisects the first of said pair of segments and being negatively maximum where said second plane bisects the second of said pair of segments.

A feature of the invention includes means for varying the gradient field uniformity by varying the lengths of the segments relative to the distance of the segments from the axis and/or the angular sizes of the segments.

A further feature of the invention comprises means for controlling enhancement of the current density at the ends of the segments.

Yet another feature of the invention comprises means for controlling the gradients along the axes perpendicular to the longitudinal axis to aid in controlling the gradient uniformity.

BRIEF DESCRIPTION OF THE DRAWING

The above mentioned and other objects and features of the invention will be best understood in the light of the following description of the invention, taken in conjunction with the accompanying drawings, wherein.

GENERAL DESCRIPTION

Figure 1:
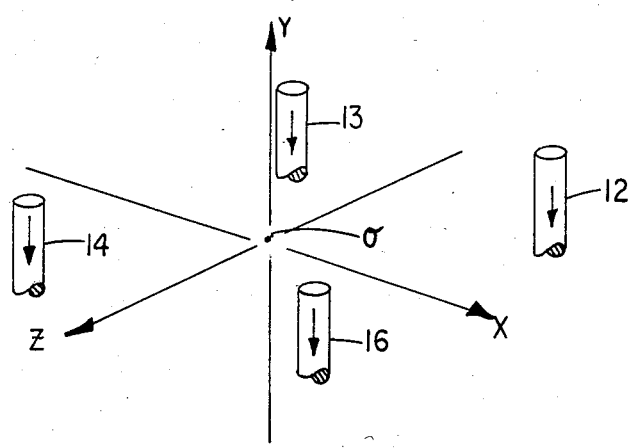
FIGS. 1 and 2 are sample showings of prior art gradient field generating arrangements.
Figure 2:
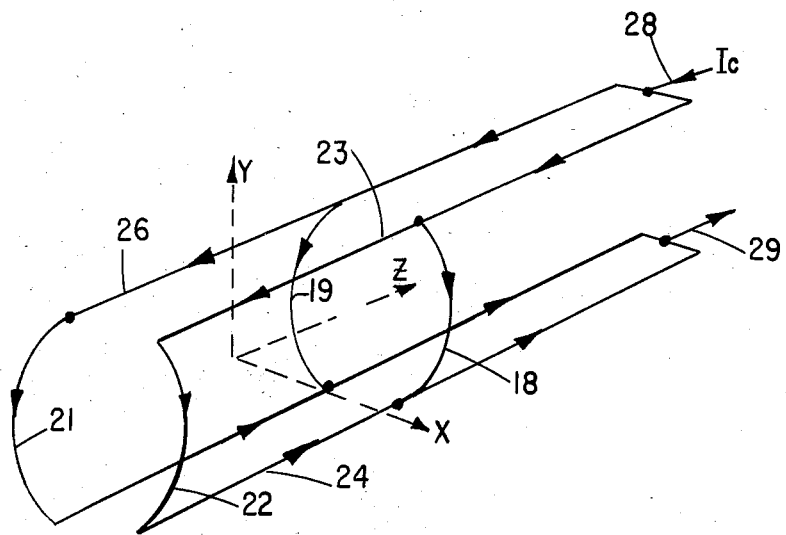

In the past the gradient fields have been generated by arrangements including the arrangements schematically depicted in FIGS. 1 and 2. In both figures the current carrying wires that cause the magnetic fields are depicted relative to X,Y and Z orthogonal axes. The axes are used to aid the explanations herein and to relate the gradient field generating arrangements to NMR imaging systems. The mirror symmetry plane referred to earlier herein is the YZ plane. In such systems the static magnetic field is generally parallel to the Z axis and in fact coaxial therewith. The inventive arrangement described herein provides gradients in the X direction and in the Y direction. The showings and descriptions herein actually is directed to gradients in the X direction but they apply with equal effect to gradients in the Y direction. The arrangements merely have to be rotated 90 degrees.

One prior art gradient field generating arrangement 11 as shown in FIG. 1 uses four theoretically infinite wires 12, 13, 14 and 16 arranged at the four corners of an imaginary rectangle having the "0" point of the orthogonal coordinate system at the center of the rectangle.

The current is directed in the same direction through each of the wires as shown by the arrows. Accordingly the magnetic fields generated are zero at the X,Y, and YZ planes. The field has a gradient along X in the XZ plane (and planes parallel thereto).

In summary the gradient is $\nabla_x \partial Bz/\partial x$.

The wires actually used are not infinite. Instead arrangements such as shown in FIG. 2 are used in prior art devices. The arrangement 17 of FIG. 2 is often referred to as a "saddle". Note that in many ways it is similar to the arrangements of FIG. 1. There are four wires 18, 19, 21, and 22 directed into the XZ plane each carrying current in the same directions, as shown by the arrows. The wires 18 and 22 are joined by wires 23 and 24, while wires 19 and 21 are joined by wires 26 and 27. The loops made up of wires 18, 23, 22, 24 and 19, 26, 21, 27 respectively are coupled in parallel from a source of constant current Ic by conductor 28 and to the source by conductor 29. Here again the gradient $\nabla_x \partial Bz/\partial x$ is generated. These prior art arrangements are the coils with the problems inherent thereto discussed above.

Discussions of gradient coils that describe these and other coil arrangements, are to be found in an article entitled "Magnetic Field Gradient Coils for NMR Imaging" by V. Bangert and P. Mansfield appeared at Page 235 et seq. of the Journal of Physics E, (Scientific Instruments) Vol. 15, 1982 and on pages 263 et seq. of a book entitled "NMR Imaging in Biomedicine" by P. Mansfield and P. G. Morris, published in 1982 by Academic Press.

Figure 3:
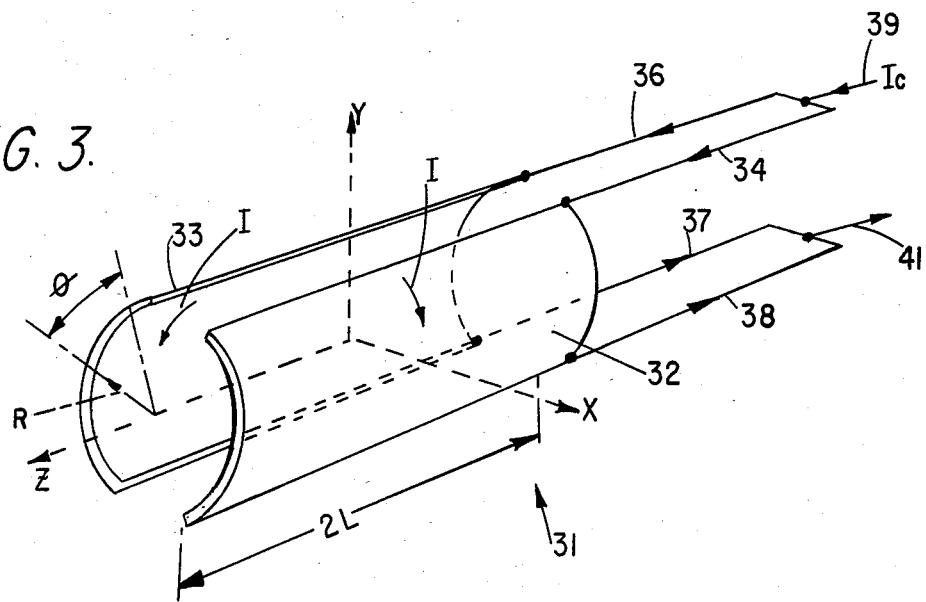
FIG. 3 is a pictorial depiction of one embodiment of the present invention.
Figure 4:
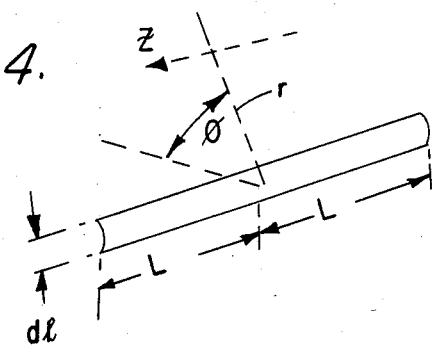
FIG. 4 is a showing of a method of mathematically analysing the arrangement of the present invention.

The inventive system 31 of FIG. 3 uses arcuate plates 32 and 33 in place of the prior art wires or coils for carrying the field producing current I. The plates 32 and 33 are preferably segments of a hollow cylinder. The current flows from the tops to the bottoms thereof to produce opposing fields. The current distribution and hence the field uniformity is not affected by the geometry of the field generating coils because there are no coils. Instead the current source Ic is coupled by conductors 34 and 36 in parallel to the tops of the plates 32 and 33, respectively.

The bottoms of the plates are coupled in parallel through conductors 37 and 38. The parallel conductors are coupled from and to the current source by conductors 39 and 41. The current in the plate is extremely uniform as compared to current in coils.

The physical characteristics that are variable, namely the length ZL and the angular size 20 of the plates, are used to help maximize the symmetry, linearity and uniformity of the gradient field. The mathematics describing the plates may be analyzed by considering a strip of a plate having a height d1 and a length 2L located in the X,Y, and Z LC orthogonal system. The field of a point P(X,Y,Z) is calculated using the Biot-Savart law and Simpson's rule integration. The field, in general, is:

$$dBz = \frac{\mu_o I\, dl \cos\theta}{4\pi r} \left[ \frac{L-z}{\sqrt{(L-z)^2 + r^2}} + \frac{L+z}{\sqrt{(L-z)^2 + r^2}} \right]$$

where:
$\mu_o$ is the permeability of air
I is the current density in the strip
z is the linear location of the field Bz
L is ½ the length of the strip
r is the radial distance of P from the strip, and
$\theta$ is the angular distance of Z from the X axis.

It should be noted that only the magnetic field Bz is relevant since the fields By an Bx are normal to the applied field Bz and therefore these fields only have second order effects.

The complete field Bz is obtained by integrating dBz over the complete segment once the values of $\theta$ and r are plugged into the equation. It should be noted that the invention is not in any way limited to the integration method suggested. It has been found that the maximum gradient uniformity is obtained when the angle $\theta$ is about $\pi/3$. Further, it has been found that when L=2R the segment is sufficiently long to ensure uniformity, where R is the radius of the cylinder.

Means are provided to enable shortening the cylindrical segments and/or improving the uniformity of the field. More particularly means are provided for increasing the current density toward the ends of the segments. In the preferred embodiment 43 of FIG. 5 the segments 32 and 33 are each divided into four sections. Thus segment 32 is divided into sections 44, 46, 47 and 48. Each section is insulated from its adjoining section. The outer sections 48 and 44 are shorter than the inner sections so that L1=L4<L2=L3 whereby each section carries the same current (series connected) but have different current densities. In a preferred embodiment L1/L3=7/9 with L=1.6R.

It has been found that the uniformity of the gradients in the X and Y directions are effected by variations in the value of $\phi$. Values of $\phi$ up to 1.08 radians gives good uniformity in the X direction while values of $\phi$ at about 1.21 radians gives good uniformity in the Y direction.

Figure 5:
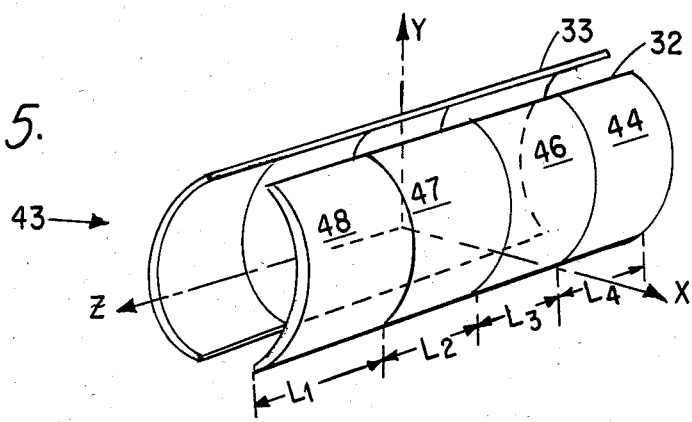
FIGS. 5 and 6 are showings of further embodiments of the present invention.

Means are provided for minimizing the sensitivity of the uniformity of the fields generated by the sectionalized segments of FIG. 5 to variations in the value of $\phi$. More particularly good uniformity in both the X and the Y directions is achieved even with some variation in the value of $\phi$ by using the arrangements 51 of FIG. 6. Therein current carrying longitudinal segments 53 and 54 are added to the arrangement 43 of FIG. 5. The segments 53 and 54 extend parallel to the Z axis about the XZ plane. This affects the gradients conversely in the X and Y directions and therefore compensates for the effects in variations in $\phi$ on the uniformity of the field gradients in the X and Y directions.

Figure 6:
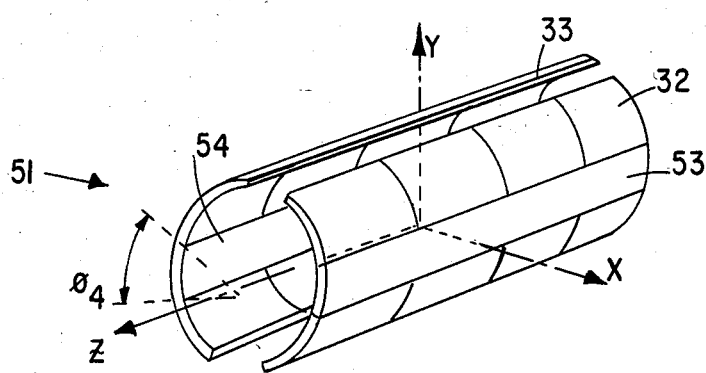
Figure 7:
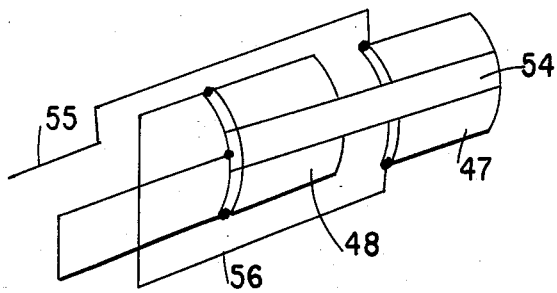
FIG. 7 is a showing of the connections of parts of the arrangement of FIG. 6.

The sections 53 and 54 are insulated from the other sections of segments and are connected in series with them. The connections between the segments are shown in FIG. 7. Note that the three sections in each quadrant, as shown in FIG. 6, effectively form three turn coils. Current entering by way of conductor 55 passes through segment 47 to conductor 56. Conductor 56 leads the current to segment 48. The current goes through segment 48 to conductor 57 which leads to segment 54 and from there to conductor 58.

In a preferred embodiment segments 53 and 54 were most effective when $\phi_4$ was 0.20 radians and $\phi$ was 1.21 radians.

In use the gradient field generating arrangements provide excellent gradient field uniformity, linearity and orthogonality by the use of conducting arcuate plates in place of wire wound coils. It is beneficial to use high current carry capacity conductors to couple the plates to the current source.

While the invention has been described using embodiments of the invention it must be understood that this description is made by way of example and not to imply any limitation on the scope of the invention.

What is claimed is:

1. A gradient field generating arrangement comprising:

a pair of oppositively disposed electrical current conductive segments of a hollow cylinder, said segments being substantially equidistantly spaced from a common longitudinal axis, means for causing current to flow in the same direction in each of said segments, the direction of the current generating a magnetic field about each of said segments that is parallel to said longitudinal axis, the combined field about each of the pair of segments being zero at all points in a first plane which is the mirror symmetry plane that relates one of said pair of segments to the other of said pair of segments, said combined field varying substantially linearily in a second plane which contains the longitudinal axis, is normal to the said first plane and longitudinally bisects said pair of segments, and said magnetic field being positively maximum where said second plane bisects said first of said pair of segments and being negatively maximum where said second plane bisects the other of said pair of segments.

2. The gradient field generating arrangement of claim 1 including means for varying the gradient field uniformity.

3. The gradient field generating arrangement of claim 1 including means for varying the lengths of said current conductive segments relative to the distance of said segments from said common longitudinal axis.

4. The gradient field generating arrangement of claim 1 including means for varying the angular size of said pair of current conductive segments.

5. The arrangement of claim 4 including means for varying the lengths of said segments relative to the distance of said segments from said common longitudinal axis.

6. The gradient field generating arrangement of claim 1 including means for controlling current density at the ends of the segments.

7. The gradient field generating arrangement of claim 6 including means for dividing said segments into sections, said sections comprised of outer sections at the ends of said segments and inner sections, said outer sections being smaller than said inner sections, means for insulating said sections from each other and means for coupling said sections in series.

8. The gradient field generating arrangment of claim 7 wherein each segment is divided into four sections with the two outer sections being smaller than the two inner sections.

9. The gradient field generating arrangement of claim 8 wherein the ratio of the length of said outer sections to the length of said inner section equals seven-ninths, and wherein the total length of each of the segments equals 1.6 times the distance between the segments and the said longitudinal axis.

10. The gradient field generating arrangement of claim 1 including means for minimizing the sentivity of the field generating arrangements to variations in the angular size of said segments.

11. The gradient field generating arrangement of claim 10 including a minor segment attached to and insulated from each of said segments about the longitudinal center points of said segments and extending substantially the complete length of each of said segments.

12. The gradient field generating arrangement of claim 11 wherein the angular size of said minor segments is equal to 0.20 radians when the angular size of each of said pair of segments is 1.21 radians.

13. The gradient field generating arrangement of claim 11 wherein means are provided for coupling the minor segments in series with said sections of the segment to which said minor segment is attached.

14. The gradient field generating arrangement of claim 1 wherein said arrangement is located in an orthogonal system wherein said minor symmetry plane is the YZ plane and said second plane is the XZ plane with said gradient affecting a magnetic field Bz and being represented as $\nabla_x = \partial Bz/\partial x$.

* * * * *